United States Patent [19]
Awano

[11] Patent Number: 5,455,441
[45] Date of Patent: Oct. 3, 1995

[54] SEMICONDUCTOR DEVICE HAVING A STRUCTURE FOR ACCELERATING CARRIERS

[75] Inventor: Yuji Awano, Tokyo, Japan

[73] Assignee: Fujitsu Limited, Kawasaki, Japan

[21] Appl. No.: 206,226

[22] Filed: Mar. 7, 1994

Related U.S. Application Data

[63] Continuation of Ser. No. 687,185, Apr. 18, 1991, abandoned.

[30] Foreign Application Priority Data

Apr. 18, 1990 [JP] Japan .................................. 2-102142

[51] Int. Cl.$^6$ ............................. H01L 27/01; H01L 29/78
[52] U.S. Cl. ........................ 257/213; 257/260; 257/280; 257/365; 257/194; 257/289
[58] Field of Search ............................. 357/22, 15, 23.1, 357/23.14, 16; 257/256, 280, 365, 194, 213, 260, 263, 266, 270, 288, 289, 366

[56] References Cited

U.S. PATENT DOCUMENTS

| | | | |
|---|---|---|---|
| 4,104,673 | 8/1978 | Dickens | 257/280 |
| 4,639,753 | 1/1987 | Yamada | 357/22 |
| 5,012,315 | 4/1991 | Shur | 357/91 |
| 5,289,027 | 2/1994 | Terrill et al. | 257/366 |

FOREIGN PATENT DOCUMENTS

| | | |
|---|---|---|
| 2163002 | 2/1986 | United Kingdom . |
| WO90/07795 | 7/1990 | WIPO . |

OTHER PUBLICATIONS

Applied Physics Letters, vol. 54, No. 2, 9 Jan. 1989, New York, US, pp. 162–164, XP68447, Michael Shur "Split-gate field-effect transistor" * whole document *.

IEEE Electron Device Letters, vol. EDL5, No. 7, Jul. 1984, New York US, pp. 270–272, B. A. Vojak et al. "A Self-Aligned Dual-Grating GaAs permeable Base Transistor" * whole document *.

Journal of Applied Physics, vol. 62, No. 9, 1 Nov. 1987, New York, US, pp. 3816–3820, Jingming Xu et al. "Ballistic transport in hot.electron trasistors" * abstract; FIG. 6*.

*Primary Examiner*—Mark V. Prenty
*Attorney, Agent, or Firm*—Staas & Halsey

[57] ABSTRACT

A semiconductor device comprises a channel of a semiconductor material for passing carriers, a carrier injecting part for injecting the carriers into the channel and establishing an ohmic contact with the channel at a first location, a carrier collecting part for collecting the carriers from the channel, the carrier collecting part establishing an ohmic contact with the channel at a second, different location, a carrier control part provided on the channel at a third location located between the first and second locations, the carrier control part being applied with a control voltage and controlling the passage of the carriers through the channel from the carrier injecting means to the carrier collecting means in response to the control voltage, and an acceleration part provided between the first and third locations including the third location. The acceleration part is supplied with an acceleration voltage and producing an electric field that accelerates the carriers such that the electric field has a magnitude generally proportional to the acceleration voltage applied thereto.

9 Claims, 15 Drawing Sheets

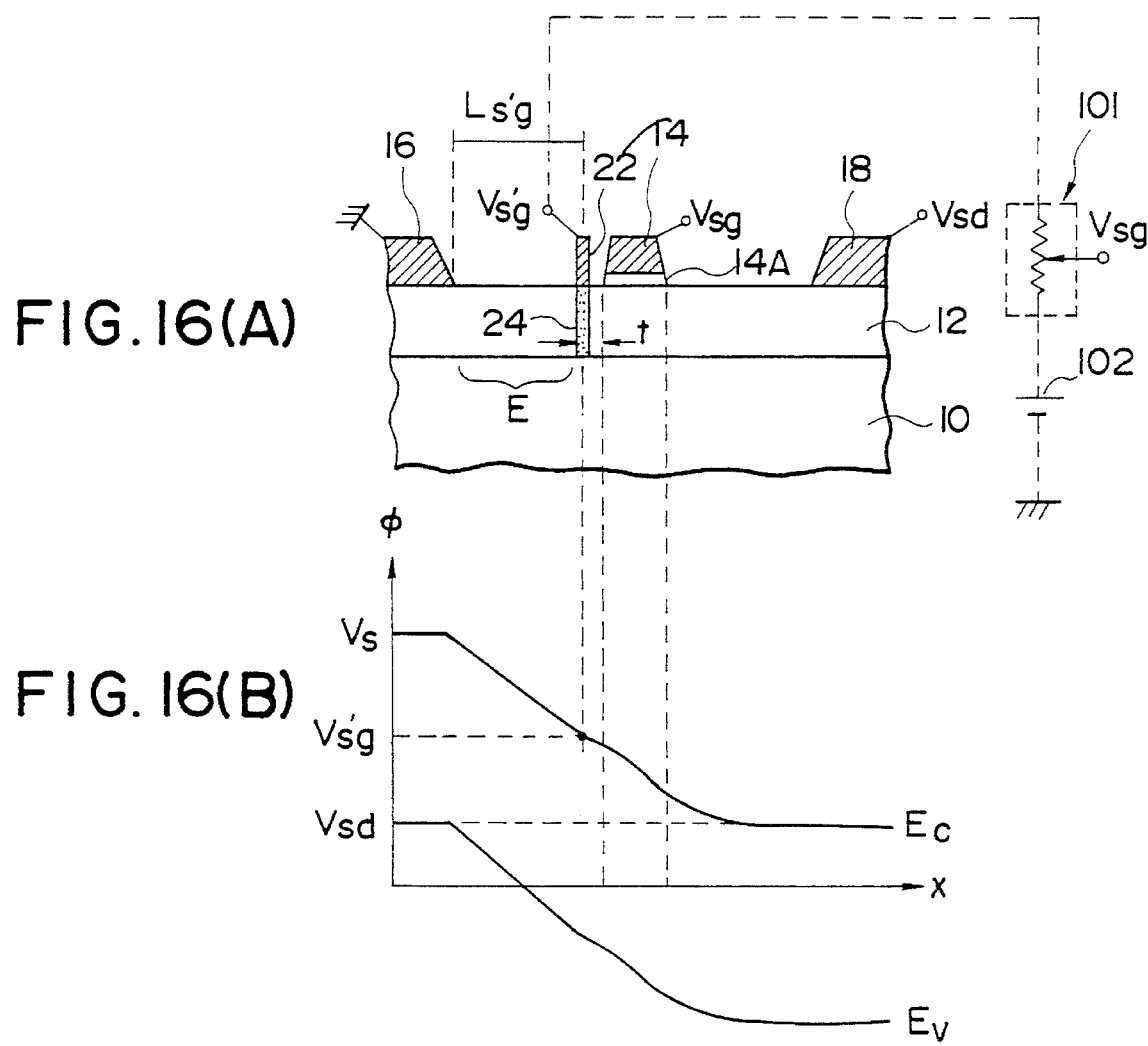

SEMICONDUCTOR DEVICE HAVING A STRUCTURE FOR ACCELERATING CARRIERS

This application is a continuation of application number 07/687,185, filed Apr. 18, 1991, now abandoned.

BACKGROUND OF THE INVENTION

Field of the Invention

The present invention generally relates to semiconductor devices, and in particular to semiconductor devices having a carrier channel wherein structure for accelerating the carriers is provided.

With the progress in the lithographic patterning technique, field effect transistors having an extremely short gate length are becoming available. In such short gate length devices, a very large electric field is induced in the carrier channel in correspondence to a region located under the gate electrode and a large acceleration of carriers is achieved in such a region of increased electric field.

FIG. 1(A) shows a fundamental structure of a conventional MESFET and FIG. 1(B) shows the band diagram corresponding to the structure of FIG. 1(A).

Referring to FIG. 1(A), the MESFET comprises a substrate 10 of semi-insulating GaAs on which an n-type GaAs layer 12 is formed. The carrier channel is formed in this device layer 12. Thus, the layer 12 will be referred to hereinafter as a channel layer. In correspondence to the carrier channel, a gate electrode 14 is provided on the top surface of the channel layer 12, and source and drain electrodes 16 and 18 are provided on the top surface of the layer 12 at both sides of the gate electrode 14 as usual. Thus, the carriers are injected into the channel layer 12 via the source electrode 16 and transported along the channel in the layer 12 to a drain region formed under the drain electrode 18 under the control of a gate voltage applied to the gate electrode 14, and collected by the drain electrode 18 as a drain current.

FIG. 1(B) shows the band diagram of the device of FIG. 1(A) in the state where a source-drain voltage $V_{sd}$ is applied across the source and drain electrodes 16 and 18 and a source-gate voltage $V_{sg}$ is applied across the source and gate electrodes 16 and 14. In FIG. 1(B) the conduction band is designated by Ec and the valence band is designated by Ev. As can be seen in FIG. 1(B), the conduction band and the valence band are generally flat in the region between the source electrode 16 and the gate electrode 14 because the resistance of the channel between the source and gate electrodes is smaller than the resistance under the gate. On the other hand, the conduction band Ec and the valence band Ev are curved steeply in the region between the gate electrode 14 and the drain electrode 18 due to the large channel resistance under the gate. The carriers are accelerated by the large electric field associated with the large potential drop. This acceleration of carrier is particularly conspicuous in the region immediately under the gate electrode 14 and is enhanced further when the gate length is reduced. The reduction of the gate length increases the slope of the band and hence the electric field as will be easily understood.

FIG. 2 shows the effect of carrier overshoot that occurs when the gate length is reduced to increase the carrier velocity as reported by Ruch (J. G. Ruch, IEEE Trans. Electron Devices ED-19, pp. 652–654, 1972). As can be seen in this diagram, an overshoot occurs in the carrier velocity under high electric field when the gate length is reduced below 1 μm. For example, it can be seen that a conspicuous overshoot is observed in the device having a gate length of less than 0.5 μm when the electric field is increased to 10 kV/cm. Thereby, the carrier velocity is increased to a level more than three times greater than in the case where the device has a gate length larger than 1 μm. When the carrier velocity is increased, the operational speed as well as the transconductance and cut-off frequency of the FET is increased.

In the conventional device of FIGS. 1(A) and 1(B), this feature of carrier overshoot is not exploited completely, since the acceleration of the carriers occurs after the carriers have passed under the gate electrode 14 in a direction toward the drain electrode 18. The acceleration of the carriers occurs after passing through the pinch-off point formed under the gate electrode 14 does not contribute significantly to the improvement of the operational characteristics. Further, it should be noted, as can be seen in the band diagram of FIG. 1(B), that the carriers are not accelerated substantially in the region of the channel between the source electrode 16 and the gate electrode 14. The conduction band Ec and the valence band Ev are generally flat in this region and thus, the electric field for accelerating the carriers is not formed. Further, the parasitic resistance of the channel layer 12, shown in FIG. 3(A) schematically as a resistor Rs, prevents high current injection into the channel under the gate. Thereby, the desired improvement of transconductance is not achieved even when there is a desirable overshoot of the carrier velocity in the part of the channel located immediately under the gate electrode 14.

In order to circumvent the latter problem, a self-aligned gate structure as shown in FIG. 3(B) is proposed. In this structure, doped source and drain regions 20a and 20b, doped to the n⁺-type for example, are formed in the channel layer 12 by the ion implantation of impurities, using the gate electrode 14 as the mask. Thereby, the carrier density is increased in the regions 20a and 20b, leading to a decrease of the parasitic resistance Rs.

This conventional structure has a problem in that, because of the region of high carrier density formed adjacent to the gate electrode 14, the breakdown voltage across the gate electrode 14 and the drain electrode 18 tends to be deteriorated. Further, such a structure increases the parasitic capacitance between the gate and source represented schematically as $C_{gs}$ in FIG. 3(B). Thereby, the high frequency response of the transistor is inevitably deteriorated. Furthermore, the FETs having short gate lengths generally have the problem of deviation of the threshold voltage from the designed value.

SUMMARY OF THE INVENTION

Accordingly, it is a general object of the present invention to provide a novel and useful field effect transistor wherein the foregoing problems are eliminated.

Another and more specific object of the present invention is to provide a field effect transistor having an increased transconductance and an improved high frequency response.

Another object of the present invention is to provide a field effect transistor wherein the acceleration of carriers occurs in substantially the entire region of the channel that extends between the source and drain electrodes.

Another object of the present invention is to provide a field effect transistor comprising a carrier channel, a source electrode for injecting carriers into the channel, a drain electrode for collecting carriers from the channel, and a gate electrode for controlling the flow of carriers in the channel, wherein a carrier acceleration means is provided in the channel between the source electrode and the gate electrode for accelerating the carriers injected at the source electrode and traveling through the channel to the drain electrode. According to the present invention, an efficient acceleration of carriers is achieved substantially in the entire channel region an the transconductance of the transistor is improved significantly together with an improvement in high frequency response, without deteriorating the breakdown characteristics or losing control of the threshold voltage.

Other objects and further features of the present invention will become apparent from the following detailed description when read in conjunction with the attached drawings.

BRIEF DESCRIPTION OF THE DRAWINGS

FIGS. 16(A) and 16(B) are diagrams showing a MOS transistor according to a fifth embodiment of the present invention and the band characteristics thereof.

DETAILED DESCRIPTION

Figure 1A:
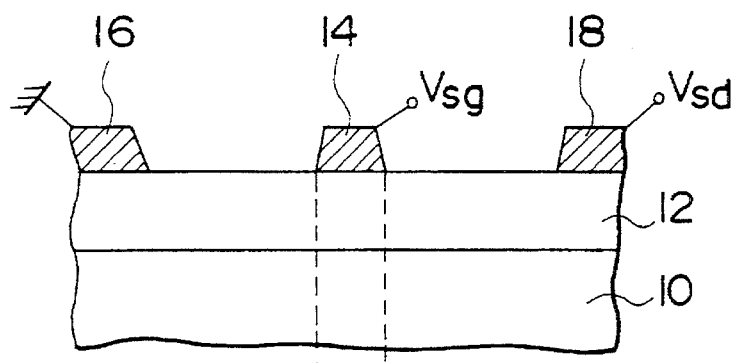
FIGS. 1 (A) and 1 (B) are diagrams respectively showing the structure and band characteristics of a conventional MESFET device.
Figure 1B:
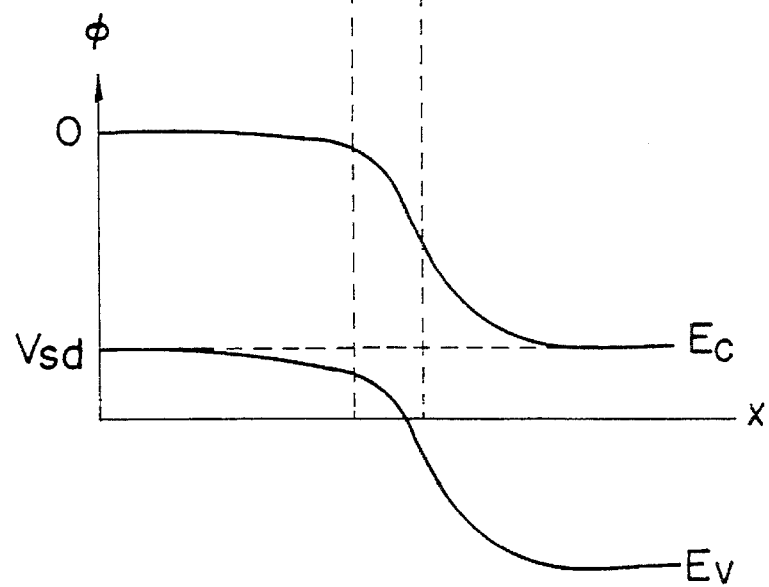
Figure 2:
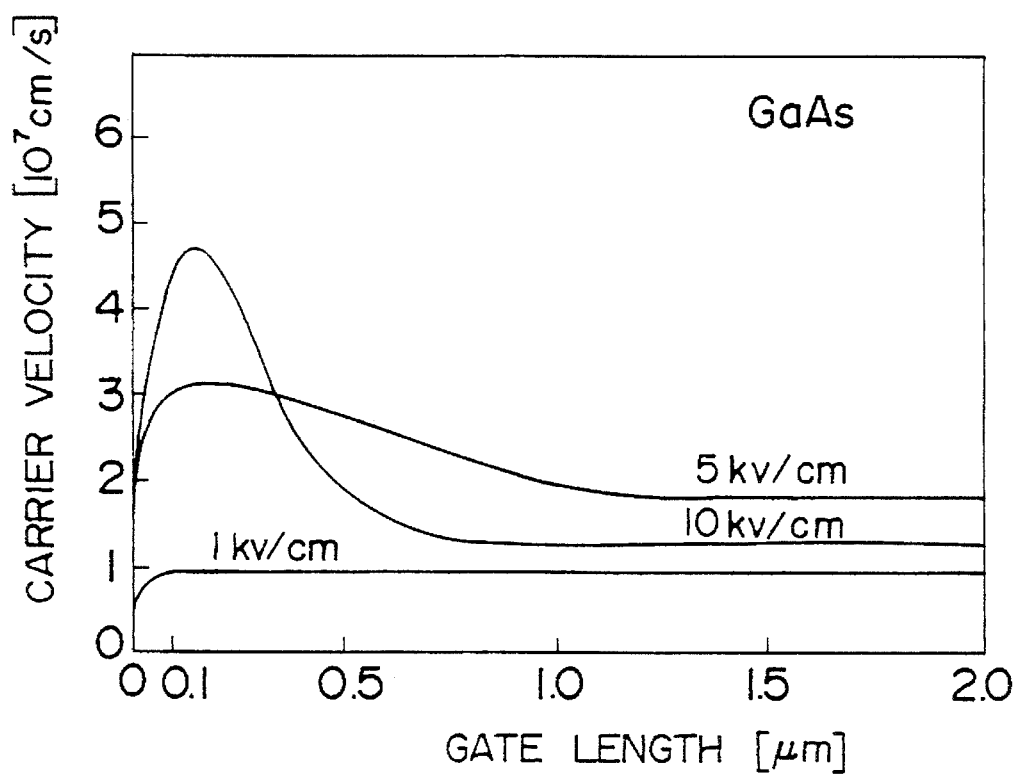
FIG. 2 is a diagram showing the effect of carrier overshoot.
Figure 3A:
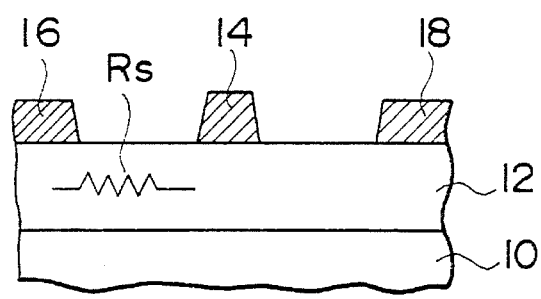
FIGS. 3(A) and 3(B) are diagrams showing the problems inherent in conventional MESFET devices.
Figure 3B:
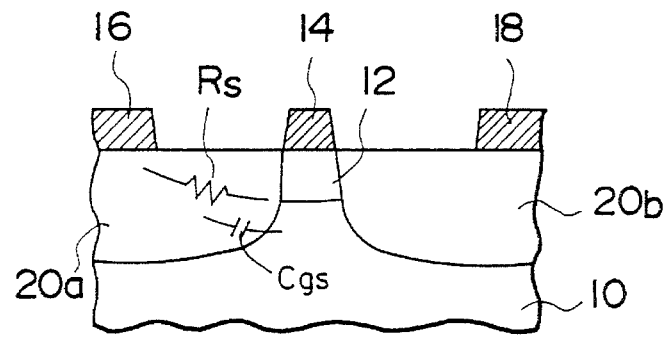
Figure 4A:
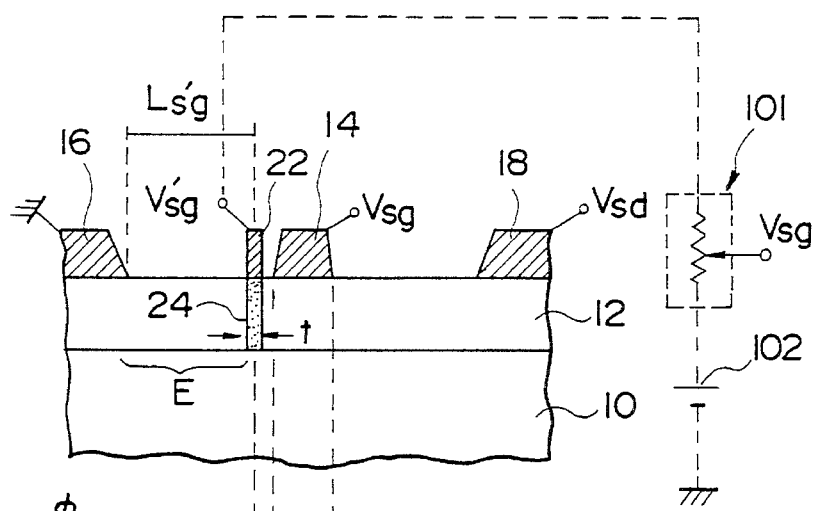
FIGS. 4(A) and 4(B) are diagrams respectively showing the structure and band characteristics of a MESFET device according to a first embodiment of the present invention.

FIG. 4(A) shows a MESFET device according to a first embodiment of the present invention. In the drawings, those portions that correspond to portions described above with reference to FIGS. 1(A), 3(A) and 3(B) are designated by the same reference numerals and the description thereof will be omitted.

In the present embodiment, there is provided a thin vertical doped region 24 of $n^+$-type GaAs in the channel layer 12 between the source electrode 16 and the gate electrode 14 at a location close to the gate electrode 14. The thin vertical doped region 24 may comprise GaAs doped with silicon with an impurity concentration level of $1 \times 10^{18}$ $cm^{-3}$ and the same has a lateral thickness t that allows tunneling of carriers therethrough. Typically, the thickness t has a value of several times $10^{-8}$ meters or less. It is desirable to have the region 24 as close as possible to the gate electrode 14. Typically, the distance between the region 24 and the gate electrode 14, measured along the upper major surface of the channel layer 12, is set at 50 nm. The channel layer 12 comprises an n-type GaAs material doped with silicon to an impurity concentration level of $1 \times 10^{17}$ $cm^{-3}$ and may have a thickness of 1000 Å.

Figure 4B:
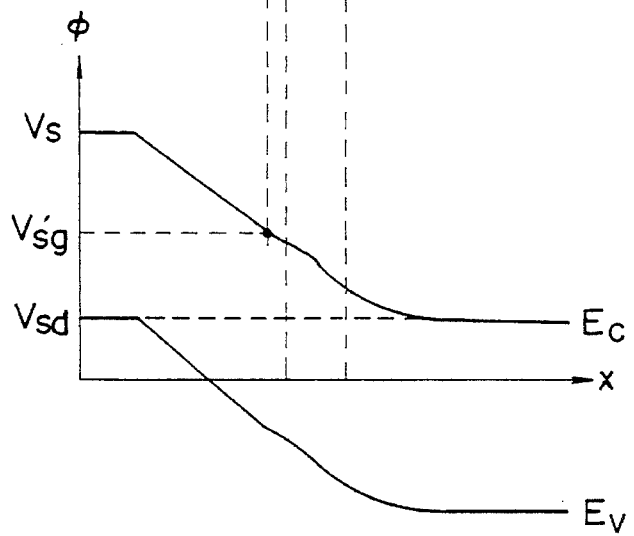

In correspondence to the $n^+$-type region 24, an electrode 22 is provided on the upper major surface of the channel layer 12 in ohmic contact with the underlying vertical region 24, and a positive voltage $V'_{sg}$ is applied across the electrode 22 and the source electrode 16. Thus, the electric potential in the channel layer 12 is pulled down as shown in the band diagram of FIG. 4(B) and a large gradient appears in the conduction band Ec and the valence band Ev in correspondence to the region between the source electrode 16 and the electrode 22. Thus, an electric field E which is generally proportional to the gradient of the band Ec in the electron channel appears in the region between the layer electrode 22 and the source electrode 16, and the electrons are accelerated not only in the region between the gate electrode 14 and the drain electrode but also between the source electrode and the electrode 22. For this reason, the electrode 22 will be referred to hereinafter as acceleration electrode or velocity enhancement electrode. It should be noted that the gradient of the band Ec and thus the accelerating electrode field E is generally proportional to the voltage $V'_{sg}$.

Figure 5:
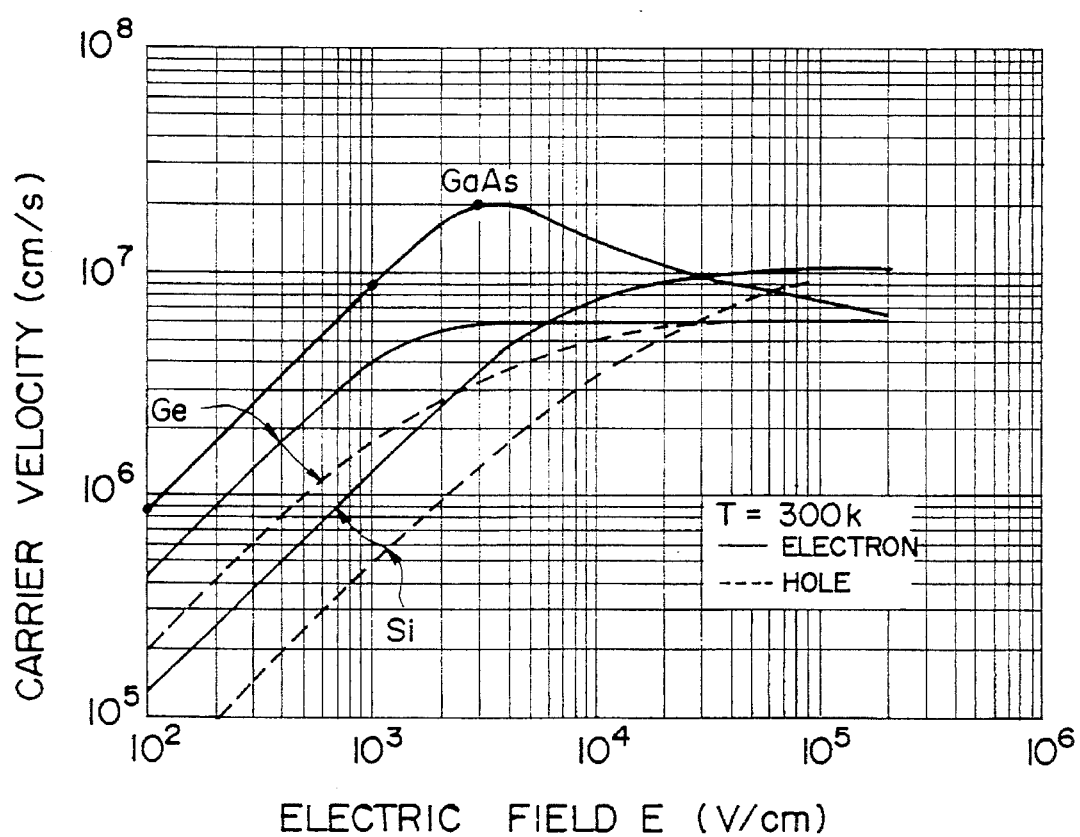
FIG. 5 is a diagram showing the relationship between the carrier velocity and the electric field in various semiconductor materials including GaAs.

FIG. 5 shows the effect of an electric field on the carrier velocity for various semiconductor materials. In FIG. 5, the solid line represents the velocity of the electrons while the broken line represents the velocity of the holes. As can be seen, the electron velocity increases generally linearly with the electronic field E in the range between $10^2$ V/cm and $10^3$ V/cm. For example, the electron velocity is about $8 \times 10^5$ cm/s in GaAs when the electric field is 100 V/cm, and when the electric field is 1 kV/cm, the electron velocity becomes about $8 \times 10^6$ cm/s. The maximum velocity is obtained when the electric field is 3–4 kV/cm. In this case, the electron speed is about $2 \times 10^7$ cm/s.

Meanwhile, the capability of conducting the current in the channel region of the MESFET is determined by the current density J of the channel region that is defined as $$J = nev = \sigma E = E/\rho,$$

where n stands for the number of electrons, e stands for the electric charge of an electron, v stands for the velocity of electrons, E stands for the electric field formed in the channel region, σ stands for the conductivity of the channel region and ρ stands for the resistivity of the channel region.

Conventionally, efforts have been made to increase the current density J by decreasing the resistivity as shown in the example of FIG. 3(B). However, the approach of FIG. 3(B) raises various problems as described previously.

The current density J can be increased also by increasing the electron velocity v In this approach, the voltage $V'_{sq}$ is set such that a desirable electric field E is formed between the source electrode 16 and the electrode 22. It should be noted that the magnitude E of the electric field E is determined as $$V'_{sg} = E/L'_{sg}$$

where $L'_{sg}$ represents the distance between the gate electrode 16 and the acceleration electrode 22. By suitably choosing the value of $V'_{sg}$, the electron velocity v can be increased by 20 times or more as compared to the conventional electron velocity, which is typically in the order of 100 V/cm. In response to this, the carrier density J representing the capability of conducting the current in the transistor is increased by 20 times or more. By using the present construction, the desirable feature of velocity overshoot of electrons under the gate electrode 14 is fully exploited and the current that can flow through the channel is significantly increased.

In the device of FIG. 4(A), the region 24 is applied with the positive voltage $V'_{sg}$ for inducing the electric field E for the acceleration of the carriers. For this purpose, a positive voltage is applied to the electrode 22 as the voltage $V'_{sg}$. Thereby, the thickness t of the region 24 must be sufficiently small such that the electrons are not trapped by the region 24 and form the drain current. For this reason, the thickness t must be sufficiently small to allow the tunneling of electrons therethrough, preferably smaller than the mean free path of the electrons in the channel. In the illustrated example, the thickness t is set at 10 nm.

Figure 6:
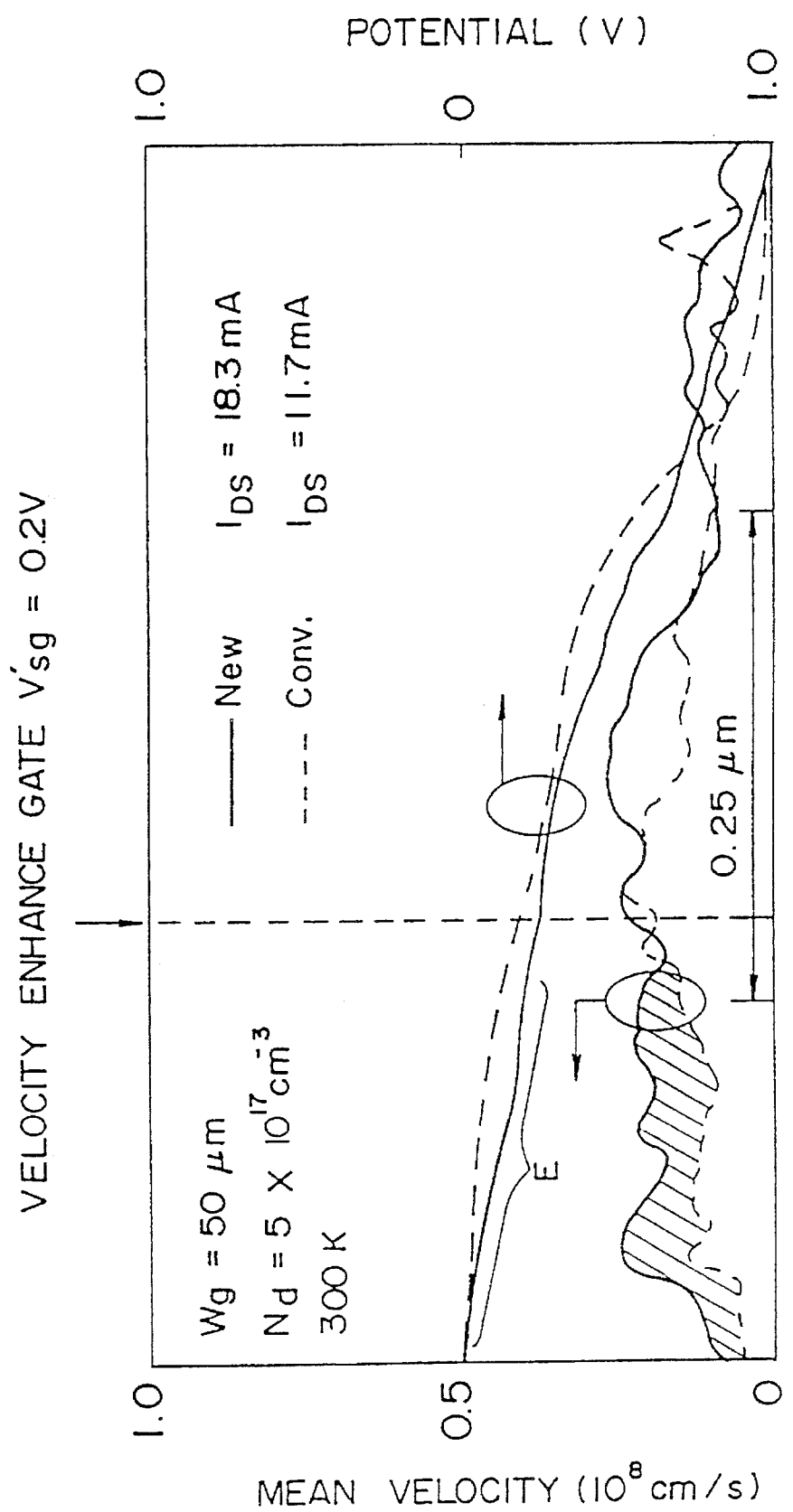
FIG. 6 is a diagram showing the effect of carrier velocity enhancement achieved by the MESFET device of the first embodiment.

FIG. 6 shows the result of simulation for the potential distribution and the mean velocity of electrons in the channel of the device of FIG. 4(A). For purposes of comparison, the potential distribution and the mean velocity of the conventional device of FIG. 1(A) that lacks the region 24 an the acceleration electrode 22 is presented. In FIG. 6, the results for the present embodiment are shown by the continuous line while the results for the conventional device are shown by the broken line. The calculations were made with regard to a device structure having a gate width Wg of 50 μm using a channel carrier density Nd of $5 \times 10^{17}$ cm$^{-3}$ while applying a voltage $V'_{sq}$ of 0.2 volts. The temperature was set at 300° K.

As can be seen, the potential gradient in the channel is generally steeper in the device of the present embodiment than in the conventional device as expected, and in response to this, the mean velocity of the electrons in the device of the present embodiment is generally larger than in the conventional device. In FIG. 6, the location of the acceleration electrode 22 is shown by the vertical arrow pointed in the downward direction. According to this simulation, it was shown that the drain-source current $I_{DS}$ increases to 18.3 mA as compared with the conventional device wherein the current $I_{DS}$ is 11.7 mA. This result indicates a remarkable improvement in the current conducting capability and in the transconductance of the transistor.

FIGS. 7(A)–7(D) and FIGS. 8(A)–8(C) illustrate a process for fabricating a first embodiment of the device of the invention.

Figure 7A:
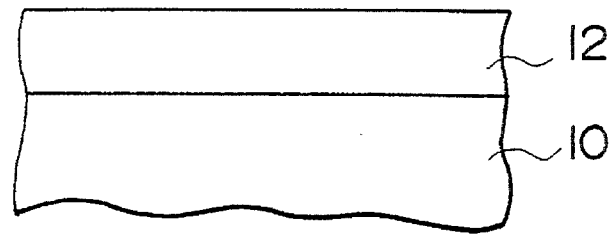
FIGS. 7(A)–7(D) and FIGS. 8(A)–8(C) are diagrams showing the fabrication process for the device of the first embodiment.
Figure 7B:
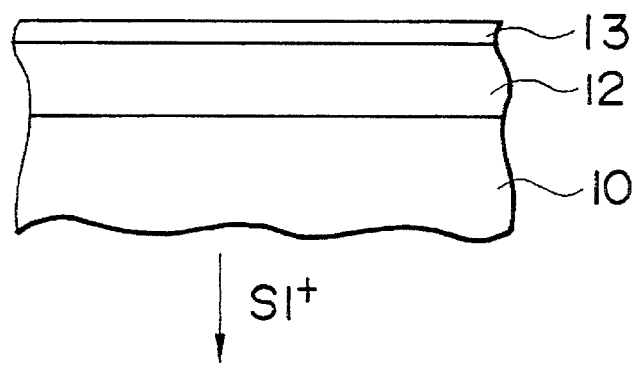

Referring to the drawings, the channel layer 12 of n-type GaAs doped with silicon to an impurity concentration level of $1 \times 10^{17}$ cm$^{-3}$ is formed on the semi-insulating substrate 10 by the molecular beam epitaxy (MBE) process to a thickness of 1000 Å as shown in FIG. 7(A). Next, an insulator layer 13 of SiON is deposited on the surface of the layer 12 as shown in FIG. 7(B) to a thickness of 500 Å by the plasma-assisted CVD process.

Figure 7C:
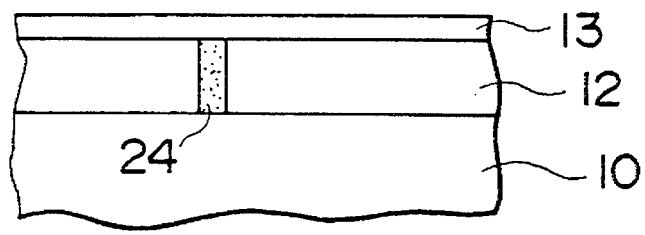

Further, a focused ion beam implantation of silicon is made into the channel layer 12 in correspondence to where the region 24 is to be formed, through the insulator layer 13. Thus, the structure of FIG. 7(C) is formed. As already described, the region 24 is doped to a high impurity concentration level such as $1 \times 10^{18}$ cm$^{-3}$ and the layer 12 is annealed thereafter at 960° C. for 5 seconds.

Figure 7D:
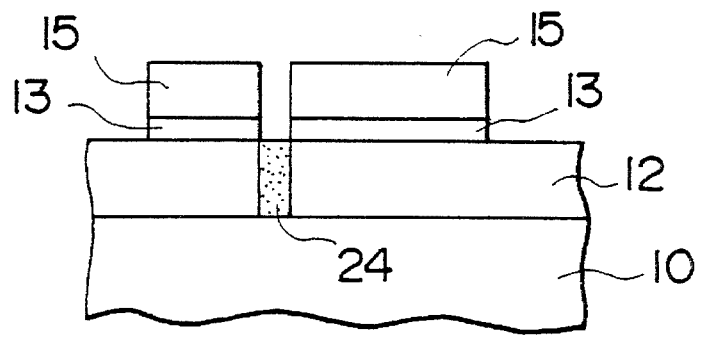

Next, an electron beam resist 15 is deposited on the insulator layer 13 and patterned subsequently to expose a part of the SiON layer 13 located immediately above the doped region 24 and those parts located immediately above the region of the channel layer 12 where the source and drain electrodes 16 and 18 are to be formed. Further, the exposed part of the SiON layer 13 is removed by the dry etching process using a mixture of $CF_4$ and helium as the etching gas as shown in FIG. 7(D).

Figure 8A:
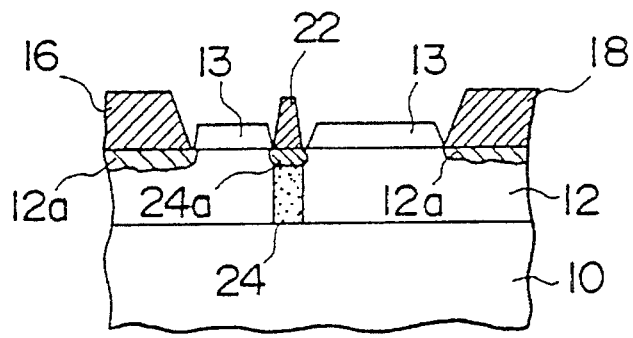
Figure 8B:
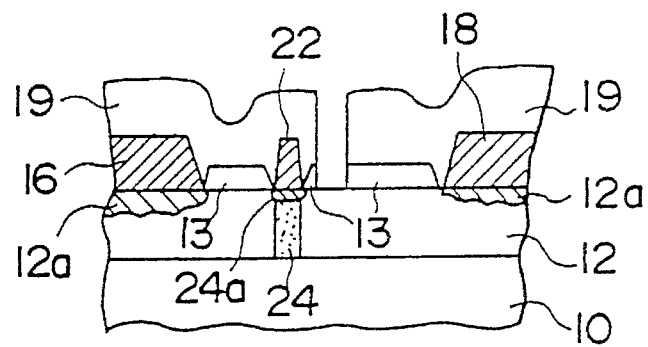

Next, a gold-germanium allow layer and a gold layer are deposited consecutively on the structure of FIG. 7(D) to a total thickness of 3000 Å and subsequently the unnecessary portions of such layers are lifted off together with the electron beam resist 15. Thereby the source electrode 16, the drain electrode 18 and the acceleration electrode 22 are formed as shown in FIG. 8(A). This structure is further annealed at 450° C. for one minute to form an alloy region 24a at the top surface of the channel layer 12 where the region 24 makes a contact with the electrode 22 as shown in FIG. 8(A). Similar alloy regions 12a are formed on the top surface of the channel layer 12 at locations where the source electrode 16 and the drain electrode 18 are formed. Thereby, the electrodes 16 and 18 as well as the electrode 22 are in ohmic contact with the underlying channel layer 12 or the doped region 24.

Further, the structure of FIG. 8(A) is covered by an electron beam resist 19 that is patterned subsequently to expose a part of the top surface of the SiON insulating layer 13 in correspondence to the position where the gate electrode 14 is to be formed. See FIG. 8(B). Further, the exposed part of the layer 13 is removed by the dry etching process described previously such that the top surface of the channel layer 12 is exposed.

Figure 8C:
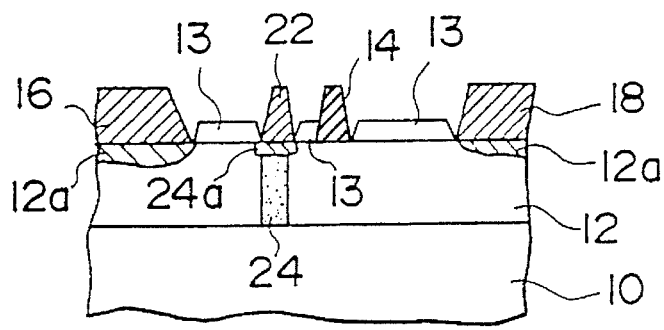

Next, an aluminum layer is deposited to a thickness of 3000 Å and the unneeded portions are lifted off subsequently together with the electron beam resist 19. Thereby the structure as shown in FIG. 8(C) is obtained. In the structure of FIG. 8(C), the top surface of the channel layer 12 that is not covered by any of the electrodes 14, 16, 18 and 22 is protected by the SiON insulating layer 13. In this respect, the device of FIG. 8(C) is more practical than the device of FIG. 4(A). It should be noted that the device of FIG. 4(A) also has the alloy regions 12a and 24a under the electrodes 16, 18 and 22, and these electrodes establish an ohmic contact with the underlying GaAs layer similar to the device of FIG. 8(C).

In the present embodiment, the doped region 24 is not limited to n$^+$-type GaAs as described, but p$^+$-type GaAs or even a metal layer may be employed as long as the acceleration electric field E is formed in the channel layer 12.

Next, the control mode of the MESFET of the present embodiment will be described briefly.

Referring to FIG. 4(A) again, this diagram shows, in addition to the MESFET device itself, a control unit 101 that is connected to a d.c. voltage source 102 for applying an acceleration voltage $V'_{sg}$ to the acceleration electrode 22. In the simplest example, this control unit 101 may apply a constant acceleration voltage $V'_{sg}$ as already described. Alternatively, this control unit 101 may control the gate voltage $V_{sg}$ so as to interrupt the application of the acceleration voltage $V'_{sg}$ to the acceleration electrode 22 when the MESFET is in the turned-off state. Thereby, the formation of unwanted unavailable drain current that is formed as a result of trapping of electrons in the doped region 24, is positively eliminated. It should be noted that such unavailable drain current becomes conspicuous in the turned-off state of the transistor in which the flow of electrons in the channel in the layer 12 from the source electrode 16 to the drain electrode 18 passing through the doped region 24, is absent. By eliminating the unavailable drain current, the power consumption of the device can be reduced.

Figure 9:
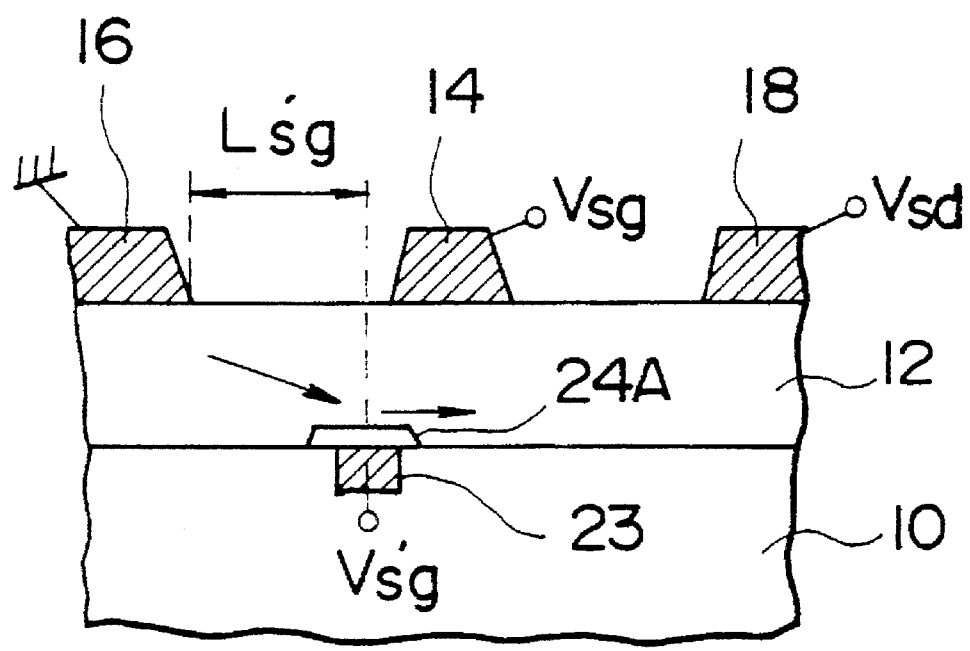
FIG. 9 is a diagram showing a MESFET device according to the second embodiment of the present invention.

Next, a second embodiment of the present invention will be described with reference to FIG. 9. In FIG. 9, those parts that have already been described with reference to the previous drawings are designated by the same reference numerals and the description thereof will be omitted. The device of the present embodiment is also a MESFET.

In the present embodiment, a region of metal such as tungsten is provided within the GaAs substrate 10 and is covered by an insulating region 24A. In the illustrated example, the region 23 is embedded in the substrate 10 and has an upper surface that is substantially flush with the upper major surface of the substrate 10, and the insulating region 24A covers the exposed upper surface of the region 23. Further, the insulating region 24A is embedded within the channel layer 12. Other parts of the device are identical with the MESFET of the first embodiment. In this device, too, the metal region 23 induces the electric field E that accelerates the electrons similarly to the first embodiment. The region 23 extends vertically to the plane of the drawing of FIG. 9 for connection to the control unit 101.

The region 23 may be located anywhere between the source electrode 16 and the gate electrode 14, including in the region immediately below the gate electrode. In order to obtain the desired acceleration of the electrons, it is desirable to position the region 23 as close as possible to the gate electrode 14 including in the region immediately below the electrode 14. Further, the vertical level of the region 23 is not limited to the position illustrated in FIG. 9 but the region 23 may be provided within the substrate 10. Alternatively, the region 23 may be provided within the channel layer 12 as long as the region 23 does not obstruct the flow of carriers. Of course, the region 23 is not limited to metals but doped semiconductors may also be used.

FIGS. 10(A)–10(D) show the fabrication process for the device of FIG. 9.

Figure 10A:
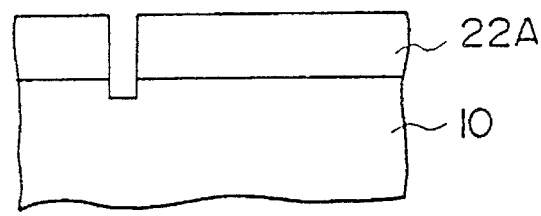
FIGS. 10(A)–10(D) are diagrams showing the fabrication process for the MESFET device of FIG. 9.

Referring to FIG. 10(A), an electron beam resist 22A is provided on the top surface of the GaAs substrate 10 and is patterned subsequently to expose a part of the top surface in which the region 23 is to be provided. Further, a dry etching process is applied using a mixture of $CCl_2F$ and helium to form a groove extending vertically to the plane of the drawing as shown in FIG. 10(A). The depth of the groove may be 1000 Å, for example.

Figure 10B:
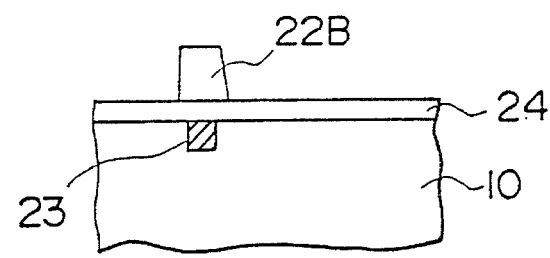

In the step of FIG. 10(B), a tungsten layer is deposited to a thickness of 1000 Å on the structure of FIG. 10(A), including the groove formed in the previous step. Next, the electron beam resist 22A is lifted off together with the tungsten layer remaining thereon. Thereby the surface of the substrate is exposed. Further, an insulator 24 of SiON or silicon oxide that forms the region 24A is deposited on the exposed top surface of the substrate 10 and another electron beam resist is applied on the top surface of the insulator layer 24. The electron beam resist thus deposited is then patterned, leaving a resist strip 22B as shown in FIG. 10(B) such that the resist strip 22B extends vertically to the plane of FIG. 10(B). This resist strip 22B protects the region of the insulator layer 24 corresponding to the region 24A of FIG. 9.

Figure 10C:
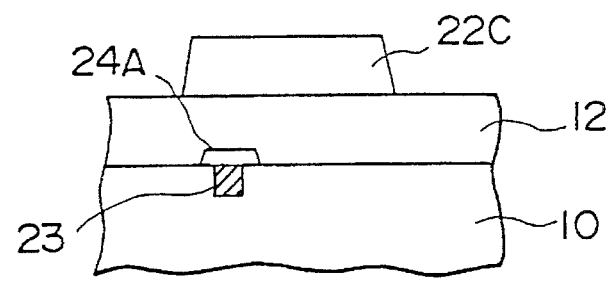
Figure 10D:
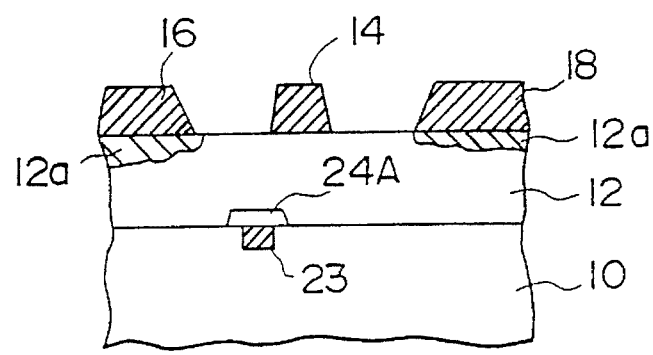

Next, in the step of FIG. 10(C), the insulator layer 24 is patterned by a dry etching process using a mixture of $CF_4$ and helium to leave the region 24A as shown in FIG. 10(C). Further, the channel layer 12 of n-type GaAs is grown on the top surface of the substrate 10 including the region 24A, and an electron beam resist layer is applied on the top surface of the layer 12. This electron beam resist is subsequently patterned to form a resist region 22C that protects the region of the channel layer 12 wherein the electron channel is to be formed. As a result, the structure shown in FIG. 10(C) is obtained.

Next, the layers of gold and gold-germanium alloy are deposited on the structure of FIG. 10(C) to a thickness of 3000 Å and unneeded portions are subsequently lifted off. Thereby, the source and the drain electrodes 16 and 18 are formed. The structure thus obtained is then annealed at 450° C. for one minute to form the alloy region 12a under the source and drain electrodes 16 and 18 similarly to the case of the first embodiment. Further, another photoresist layer (not shown) is deposited on the structure thus obtained and then patterned to expose the surface of the channel layer 12 where the gate electrode is to be formed. On this structure, an aluminum layer is deposited to a thickness of 3000 Å by sputtering and the unwanted portions are lifted off subsequently. Thereby, the gate electrode 14 is formed so as to have a Schottky contact with the underlying channel layer 12. As already noted, the region 23 may be formed by focused ion beam implantation. In this case, the groove is not formed in the channel layer 12 in the step of FIG. 10(A). Instead, an ion implantation is conducted through the window formed in the electron beam resist 22A.

Next, a third embodiment of the present invention will be described with reference to FIG. 11.

Figure 11:
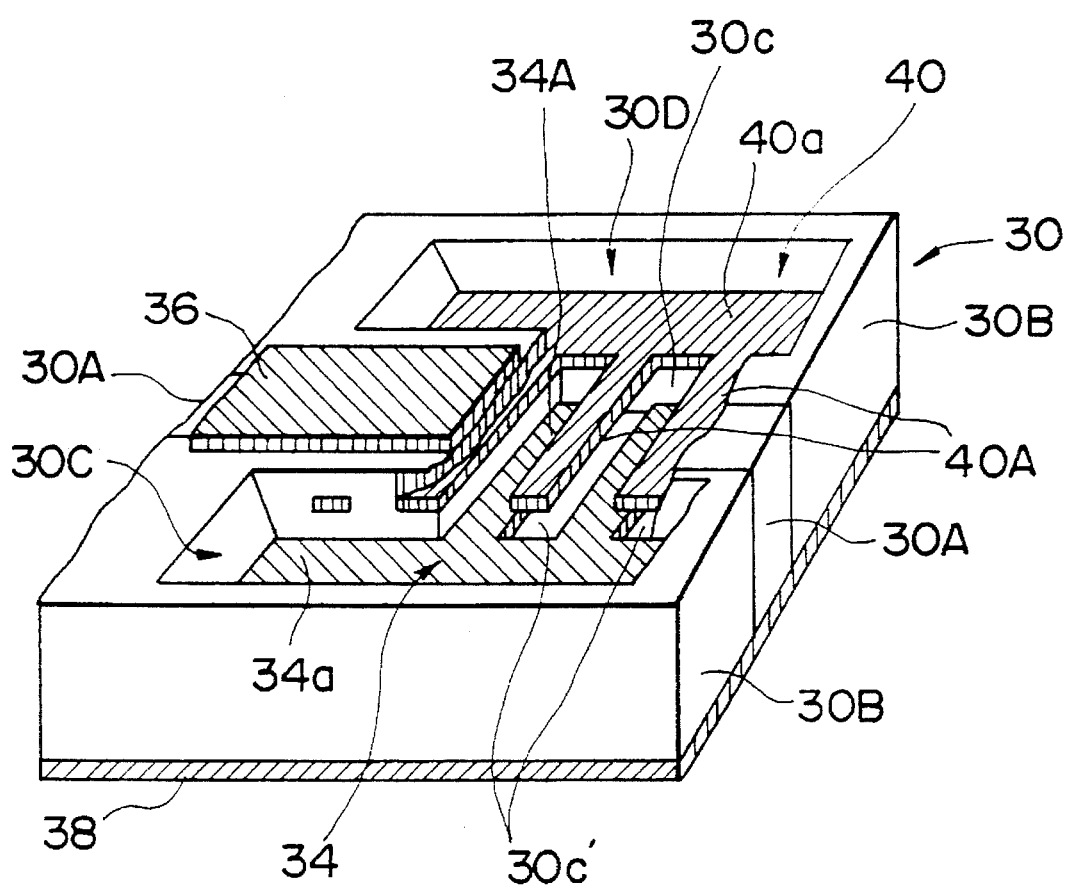
FIG. 11 and FIGS. 12(A) and 12(B) are diagrams showing a permeable base transistor according to a third embodiment of the present invention.

Referring to FIG. 11, the device of the present embodiment is a permeable base transistor formed in a $n^+$-type semiconductor layered body 30. The n-type GaAs body 30 is divided vertically into an active region 30A and an isolation region 30B, wherein the isolation region 30B is formed by ion implantation such as proton implantation.

In the GaAs body 30, a depression 30C is formed as shown in FIG. 11 and a base electrode 34 of tungsten or the like is formed within the depression 30C. The base electrode 34 has a number of fingers 34A and the structure is arranged such that the fingers 34A extend in parallelism relative to each other along a bottom surface 30C' of the depression 30C to a side wall 30c that defines the lateral boundary of the depression 30C. Thereby, the carrier channel is formed in the strip-like regions formed between adjacent fingers 34A. In FIG. 11, this carrier channel is shown as a void for the sake of illustration of the structure. In the actual device, this channel region is filled by n-type GaAs.

On the base electrode 34, a channel layer of n-type GaAs, which is also not shown in FIG. 11, is provided in continuation to the foregoing n-type GaAs channels such that the n-type GaAs channel layer buries the fingers 34A of the base electrode 34. The base electrode 34 has a bonding pad region 34a that is exposed for external connection. An acceleration electrode 40 that is relevant to the subject matter of the present invention is provided on the n-type GaAs layer. The acceleration electrode 40 may comprise a metal such as tungsten or heavily doped semiconductor material as has a number of fingers 40A extending in parallelism relative to each other for accelerating the electrons that have passed through the channels between the fingers 34A.

A channel layer of n-type GaAs is grown on electrode 40 to bury the fingers 40A such that the GaAs layer is continuously to the underlying GaAs channel layer not shown. The acceleration electrode 40 has a bonding pad region 40a that is exposed for external connection. Further, an emitter electrode 36 is provided on the upper major surface of the channel layer that buries the fingers 40A of the acceleration electrode. Further, in correspondence to the lower major surface of the semiconductor body 30, a collector electrode 38 is provided.

Figure 12A:
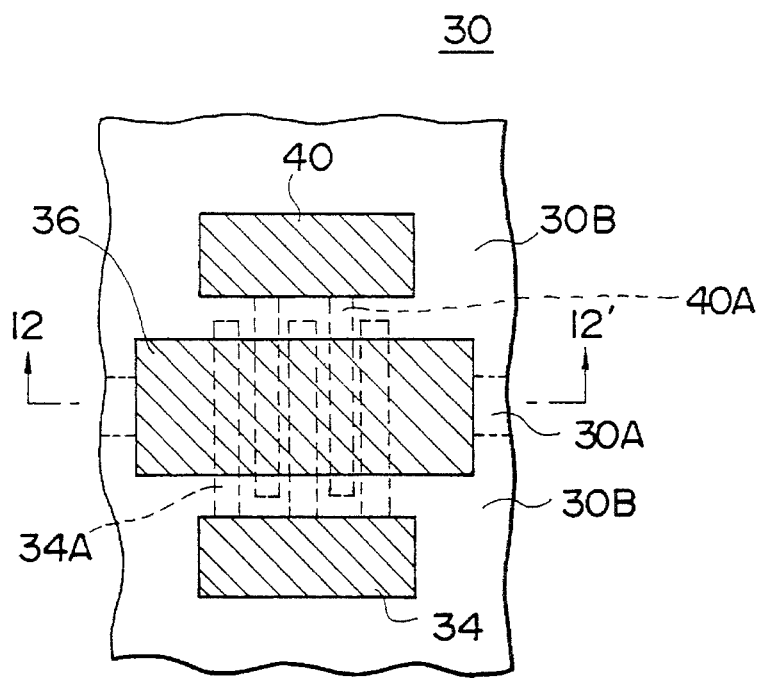

FIG. 12(A) shows the plan view of the structure of FIG. 11. As can be seen, the electrodes 34, 36 and 40 are exposed when viewed from the upward direction of the device. Further, it can be seen that the fingers 34A of the base electrode 34 and the fingers 40A of the acceleration electrode 40 are buried under the GaAs layer forming the body 30 and such fingers are arranged alternately in the 12–12' direction.

Figure 12B:
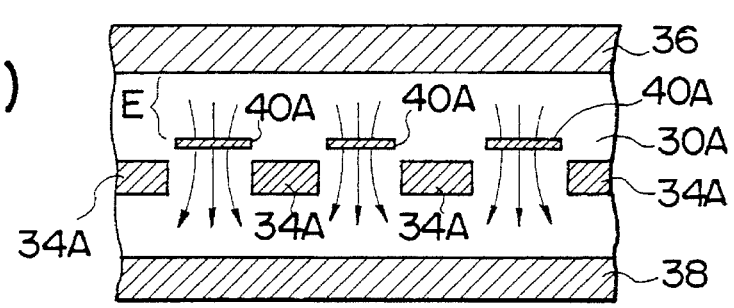

FIG. 12(B) shows the cross section of the structure of FIG. 12(A) in a view taken along the lines 12–12'. As can be seen, the fingers 34A and the fingers 40A are formed at different levels and the electrons that have been emitted from the emitter electrode 36 are transported to the collector electrode 38 through the n-type GaAs channel between the adjacent fingers 34A of the base electrode as shown by the arrows. Thereby, the flow of electrons is controlled in response to the voltage applied to the base electrode 34.

On the other hand, the acceleration electrode 40 is applied with a positive acceleration voltage, and the fingers 40A induce an electric field E that increases the velocity of the electrons by inducing the acceleration electric field. Each finger 40A has a thickness that is sufficiently small to allow the tunneling of electrons. Preferably, the thickness of the fingers 40A is set so as to be approximately equal to or smaller than the mean free path of electrons. In the illustrated example, the thickness of each finger electrode 40A is set at 10 nm.

The structure of the permeable base transistor of FIG. 11 may be formed by the process of depositing the layer forming the base electrode 34 on an n-type GaAs layer, patterning the same to form the finger electrodes 34A, depositing another layer of n-type GaAs to bury the base electrode 34 including the fingers 34A, depositing the layer forming the acceleration electrode 40 on the n-type GaAs layer that buries the base electrode 34, patterning the electrode 40 to form the fingers 40A, depositing still another n-type GaAs layer on the electrode 40 to bury the fingers 40A underneath, forming the contact hole 30D to expose a bonding pad region of the electrode 40, and forming another contact hole 30C to expose a bonding pad region of the electrode 34. Permeable base transistors are discussed in U.S. Pat. No. 4,378,629, which is incorporated herein by reference.

Figure 13:
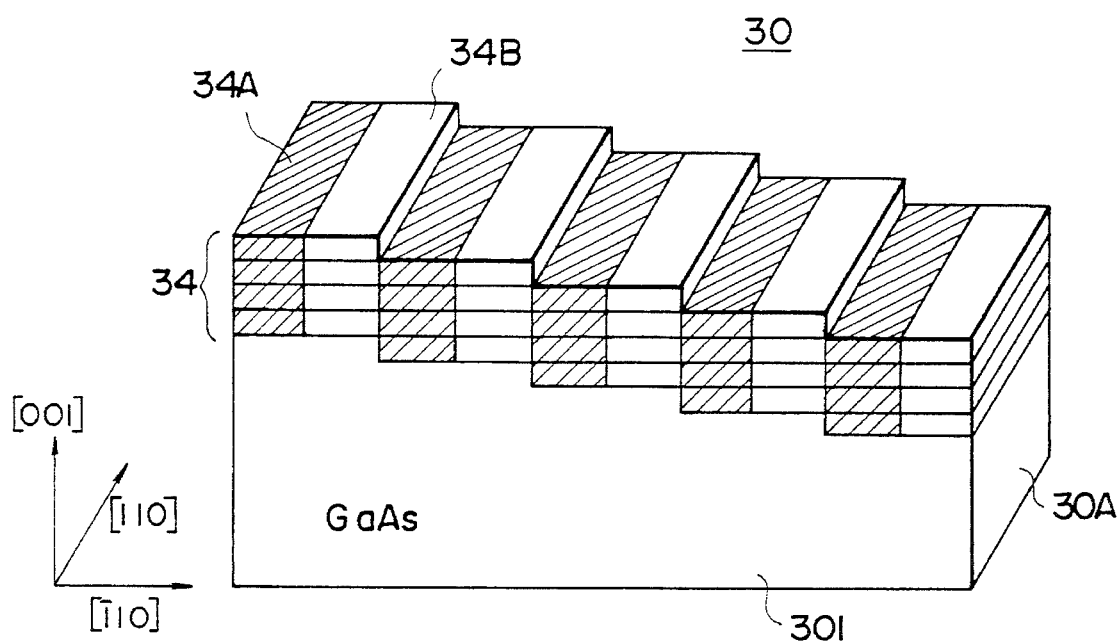
FIG. 13 is a diagram showing a layered semiconductor body forming an essential part of the transistor of FIG. 11.
Figure 14:
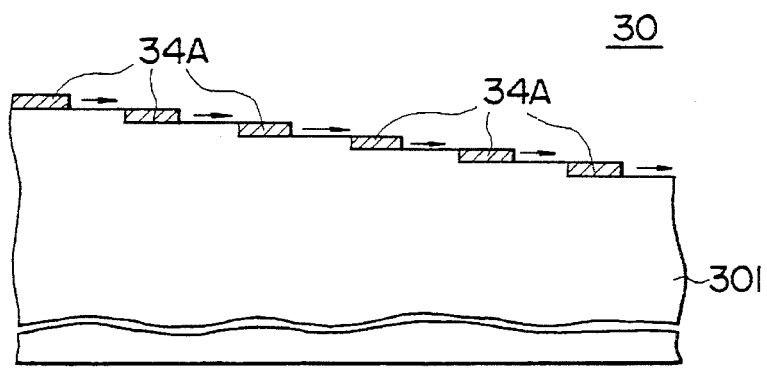
FIG. 14 is a diagram showing the fabrication process for the layered semiconductor body of FIG. 13.

Alternatively, the finger electrodes 34A and the finger electrodes 40A may be formed by the process shown in FIGS. 13 and 14.

Referring to FIG. 13, an n-type GaAs layer 301, on which the active region 30A and the isolation region 30B are to be formed, is prepared so as to have a step upper major surface, and the fingers electrodes 34A and the n-type GaAs channel regions 34B are formed on the upper major surface of the layer 301 such that a finger electrode 34A and a channel region 34B are formed on each step adjacent to each other. Thereby, the finger electrodes 34A and the channel regions 34B form a fractional superlattice structure on the n-type GaAs layer 301. FIG. 14 shows the lateral growth process made on each step of the upper major surface of the GaAs layer 301. As can be seen, the layers 34A are grown, for example by the MBE or MOCVD process, from a first edge of the step toward a second opposing edge of the step. The growth is interrupted before the layer 34A covers the entire surface of the step and the growth of the channel region 34B is started from the edge of the layer 34A until it covers the remaining surface of the step completely. This process is repeated for each of the steps of the upper major surface of the GaAs layer 301.

After the structure of FIG. 13 is formed, an n-type GaAs layer (not shown in FIG. 13) is deposited further on the stepped upper major surface of the fractional superlattice structure of the regions 34A and 34B. Thereby, the GaAs layer thus deposited exhibits a stepped upper major surface corresponding to the stepped upper major surface of the GaAs layer 301. The acceleration electrodes 40A are formed on the stepped surface in a manner similar to the case of the electrodes 34A and in correspondence to the channel regions 34B which are located underneath as shown in the vertical cross section of FIG. 12(B). In this case, too, the electrodes 40A form, together with an intervening strip-like n-type GaAs region, a fractional superlattice structure similar to the one shown in FIG. 13. As the fractional superlattice structure thus formed is substantially identical with the structure shown in FIG. 13, the illustration thereof will be omitted.

After the fractional superlattice structure including both the finger electrodes 34A and the finger electrodes 40A is formed, an n-type GaAs layer is deposited thereon and the layered body 30 of the device of FIG. 11 is completed. Further, the layered body 30 is subjected to ion-implantation process of protons such that the active region 30A and the isolation region 30B are formed as shown in FIG. 11. Further, the contact openings 30C and 30D are formed and electrodes 34 and 40 are deposited in electric connection with the fingers 34A and the fingers 40A respectively.

Next, the fourth embodiment of the present invention will be described with reference to FIG. 15.

Figure 15:
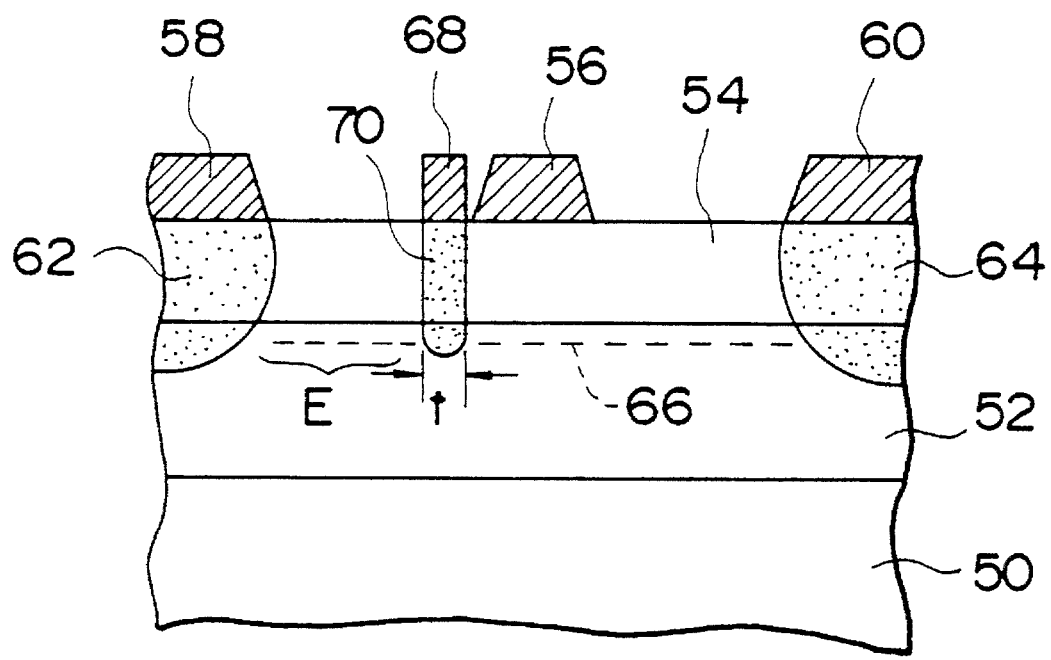
FIG. 15 is a diagram showing a HEMT device according to a fourth embodiment of the present invention.

Referring to FIG. 15, the device of the present invention is a HEMT formed on a substrate 50 of semi-insulating GaAs. On the substrate 50, there is provided an undoped active layer 52 of GaAs on which a doped layer 54 of n-type AlGaAs is provided for supplying electrons as usual. Thereby a two-dimensional electron gas 66 is formed in the active layer 52 along the interface boundary to the overlying layer 54.

On the upper major surface of the doped layer 54, a gate electrode 56 is provided so as to form a Schottky contact, and a source electrode 58 and a drain electrode 60 are provided on the upper major surface on opposite sides of the gate electrode 56. Under the source electrode 58 and the drain electrode 60, a doped source region 62 and a doped drain region 64 are formed respectively, so as to have an ohmic contact with the overlying source electrode 58 and the drain electrode 60.

In this structure, a third electrode 68 is provided between the gate electrode 56 and the source electrode 58 at a location close to the gate electrode 56 with an ohmic contact with the underlying active layer 52. In correspondence to the electrode 68, there is formed a doped region 70 of $n^+$-type in the n-type AlGaAs layer 54 such that the doped region 70 extends into the two-dimensional electron gas 66. Similar to the case of the first embodiment, the region 70 has a thickness t in the active layer 52 that is set to pass the electrons freely by tunneling. Typically, the region 70 may be formed by the focused ion beam implantation process of silicon so as to have a concentration level of $1 \times 10^{18}$ $cm^{-3}$. The electrode 68 is formed by a process similar to the process described previously in FIGS. 7(A)–7(D) and FIGS. 8(A)–8(C). Thus, the description of the fabrication process of the device of FIG. 15 will be omitted.

In operation, a positive acceleration voltage is applied to the electrode 68 such that the region 70 induces an electric field E that accelerates the electrons. Thereby, the electron velocity is increased and the transconductance of the device is increased significantly. As the general operation of the HEMT is well known in the art, further description of the operation of the device will be omitted.

The present invention as described with reference to the first embodiment is also applicable to the MOS transistors for increasing the transconductance and improving the response. FIG. 16(A) shows the structure of the MOS transistor according to a fifth embodiment of the present invention and FIG. 16(B) is a band diagram showing the band characteristics of the device of FIG. 16(A). In the MOS transistor of FIG. 16(A), a gate insulator film 14A is provided underneath the gate electrode 14. As the application of the present invention to the MOS device of FIG. 16(A) is easily derived from the description with reference to FIGS. 4(A) and 4(B), further description will be omitted. Further, the carriers used in the semiconductor device are not limited to electrons but holes may be employed as the carriers as well.

Further, the present invention is not limited to the embodiments described heretofore, but various variations and modifications may be made without departing from the scope of the invention.

What is claimed is:

1. A semiconductor device, comprising:

a channel of a semiconductor material for passing carriers;

carrier injecting means for injecting carriers into the channel at a first location of the channel;

carrier collecting means for collecting carriers from the channel at a second, different location of the channel;

carrier control means provided on the channel at a third location located between the first and second locations, said carrier control means being applied with a control voltage and controlling the passage of the carriers through the channel from the carrier injecting means to the carrier collecting means in response to the control voltage; and acceleration means provided between the first and third locations, said acceleration means being supplied with an acceleration voltage for producing an electric field that accelerates the carriers such that the electric field has a magnitude generally proportional to the acceleration voltage supplied to the acceleration means, said channel comprising a semiconductor layer having a upper major surface and a lower major surface, said first, second and third locations being defined on the upper major surface of the semiconductor layer that forms the channel such that the location is located between the first and second locations, said carrier injecting means and said carrier collecting means being provided on the upper major surface of the semiconductor layer forming the channel at said first and second locations respectively, said carrier control means being provided on the upper major surface of the semiconductor layer forming the channel at said third location, said carrier control means creating a depletion region in the semiconductor layer in response to the control voltage applied thereto, said acceleration means comprising a conductive region provided in the vicinity of the lower major surface of the semiconductor layer at a fourth location defined between the first and third locations including the third location.

2. A semiconductor device as claimed in claim 1 in which said semiconductor device further comprises a substrate having an upper major surface and a lower major surface, said substrate being provided such that the semiconductor layer is provided on the upper major surface of the substrate, said conductive region being embedded in the substrate.

3. A semiconductor device, comprising:

a channel of a semiconductor material for passing carriers;

a carrier injector for injecting carriers into the channel at a first location of the channel;

a carrier collector for collecting carriers from the channel at a second, different location of the channel;

a carrier controller provided on the channel at a third location located between the first and second locations, said carrier controller being applied with a control voltage and controlling passage of the carriers through the channel from the carrier injector to the carrier collector in response to the control voltage; and a carrier accelerator provided between the first and third locations, said accelerator establishing an ohmic contact with said channel and producing an electric field in said channel when supplied with an acceleration voltage that accelerates the carriers, said accelerator being constructed such that the electric field has a magnitude generally proportional to the acceleration voltage supplied to the acceleration, said device being constructed and arranged such that no electrode is positioned between the carrier injector and the carrier accelerator 4. A semiconductor device comprising:

a channel for passing carriers, said channel comprising a semiconductor layer having an upper major surface and a lower major surface;

a carrier injector for injecting carriers into the channel disposed at a first location on said upper major surface;

a carrier collector for collecting carriers from the channel disposed at a second, different location on said upper major surface;

a carrier controller provided on said upper major surface at a third location disposed between said first and second locations, said carrier controller being applied with a control voltage and controlling the passage of the carriers through the channel from the carrier injector to the carrier collector in response to the control voltage; and a carrier accelerator provided at a fourth location between the first and third locations, said accelerator establishing an ohmic contact with said channel and producing an electric field in the channel when supplied with an acceleration voltage that accelerates the carriers, said accelerator being constructed such that the electric field has a magnitude generally proportional to the acceleration voltage supplied to the accelerator, said carrier controller forming a depletion region in the semiconductor layer in response to the control voltage applied thereto, said accelerator comprising a conductive region formed in the semiconductor layer extending from the upper major surface to the lower major surface at said fourth location and an acceleration electrode provided on the upper major surface of the semiconductor layer in ohmic contact with the conductive region, said conductive region having a lateral thickness measured in a direction parallel to the upper major surface of the semiconductor layer and pointing toward the carrier collector from the carrier injector, such that the conductive region allows passage of the carriers therethrough by tunneling.

5. A semiconductor device as claimed in claim 4 in which said fourth location is disposed closer to the third location than the first location.

6. A semiconductor device as claimed in claim 4 in which said carrier controller comprises a gate electrode provided on the upper major surface of the semiconductor layer.

7. A semiconductor device as claimed in claim 4 in which said carrier controller comprises an insulator layer having an upper major surface and a lower major surface provided at the upper major surface of the semiconductor layer and a control electrode provided on the upper major surface of the insulator layer.

8. A semiconductor device, comprising:

a channel of a semiconductor material for passing carriers;

a carrier injector for injecting carriers into the channel at a first location of the channel;

a carrier collector for collecting carriers from the channel at a second, different location of the channel;

a carrier controller provided on the channel at a third location located between the first and second locations, said carrier controller being applied with a control voltage and controlling the passage of the carriers through the channel from the carrier injector to the carrier collector in response to the control voltage; and a carrier accelerator provided between the first and third locations, said accelerator establishing an ohmic contact with said channel and producing an electric field in said channel when supplied with an acceleration voltage that accelerates the carriers, said accelerator being constructed such that the electric field has a magnitude generally proportional to the acceleration voltage supplied to the accelerator, said carrier controller comprising a plurality of conductive regions defining a plurality of passages for the carriers between adjacent conductive regions, said accelerator comprising a conductive plate-like region having first and second opposing major surfaces, said conductive plate-like region being provided such that said first and second major surfaces intersect a flow of the carriers, said conductive plate-like region having a thickness, measured across the first and second opposing major surfaces, such that the carriers pass through the plate-like region by tunneling.

9. A semiconductor device, comprising:

a channel of a semiconductor material for passing carriers;

a carrier injector for injecting carriers into the channel at a first location of the channel;

a carrier collector for collecting carriers from the channel at a second, different location of the channel;

a carrier controller provided on the channel at a third location located between the first and second locations, said carrier controller being applied with a control voltage and controlling the passage of the carriers through the channel from the carrier injector to the carrier collector in response to the control voltage; and a carrier accelerator provided between the first and third locations, said accelerator establishing an ohmic contact with said channel and producing an electric field in said channel when supplied with an acceleration voltage that accelerates the carriers, said accelerator being constructed such that the electric field has a magnitude generally proportional to the acceleration voltage supplied to the accelerator, said channel comprising an undoped semiconductor layer having an upper major surface and a lower major surface, a doped semiconductor layer having an upper major surface and a lower major surface provided on the upper major surface of the undoped semiconductor layer, and a two-dimensional carrier gas formed in the undoped semiconductor layer along the upper major surface thereof, said carrier injector including a source electrode provided on the upper major surface of the doped semiconductor layer and establishing ohmic contact with the doped semiconductor layer at a location in correspondence with said first location, said carrier collector including a drain electrode provided on the upper major surface of the doped semiconductor layer and establishing ohmic contact with the doped semiconductor layer at a location in correspondence with said second location, said carrier controller comprising a gate electrode provided on the upper major surface of the doped semiconductor layer in correspondence to said third location with a Schottky contact to the doped semiconductor layer, said accelerator comprising a conductive region formed in the doped semiconductor layer at a fourth location between the first and third locations so as to extend from the upper major surface to the lower major surface of the doped semiconductor layer into the undoped semiconductor layer such that the conductive region intersects the two-dimensional electron gas, and an ohmic electrode forming an ohmic contact with the conductive region.

* * * * *

UNITED STATES PATENT AND TRADEMARK OFFICE
CERTIFICATE OF CORRECTION

PATENT NO. : 5,455,441
DATED : October 3, 1995
INVENTOR(S) : Yuji AWANO

It is certified that error appears in the above-indentified patent and that said Letters Patent is hereby corrected as shown below:

Column 4, line 63, delete "$V'_{sq}$" and substitute --$V'_{sg}$--.

Column 7,
line 43, delete "$CCl_2Fand$" and substitute --$CCl_2F_2$ and--.

Column 11, line 44, insert --third-- after "the" second occurrence.

Signed and Sealed this

Sixteenth Day of January, 1996

BRUCE LEHMAN

Attest:

Attesting Officer

Commissioner of Patents and Trademarks